US006792062B2

United States Patent
Vaucher (10) Patent No.: US 6,792,062 B2
(45) Date of Patent: Sep. 14, 2004

(54) DIFFERENTIAL PHASE-LOCKED-LOOP CIRCUIT

(75) Inventor: Cicero Silveira Vaucher, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 572 days.

(21) Appl. No.: 09/843,500

(22) Filed: Apr. 26, 2001

(65) Prior Publication Data

US 2001/0052807 A1 Dec. 20, 2001

(30) Foreign Application Priority Data

Apr. 27, 2000 (EP) .............................................. 00201504

(51) Int. Cl.[7] .............................. H03D 3/24; H03L 7/06
(52) U.S. Cl. ........................ 375/374; 375/376; 327/157
(58) Field of Search ................................ 375/371, 373, 375/374, 375, 376; 327/141, 146, 147, 148, 155, 156, 157, 162, 163

(56) References Cited

U.S. PATENT DOCUMENTS

| 4,695,747 | A |   | 9/1987 | Latham ....................... 307/317 |
| 5,736,880 | A | * | 4/1998 | Bruccoleri et al. .......... 327/157 |
| 5,740,213 | A | * | 4/1998 | Dreyer ........................ 375/374 |
| 5,767,736 | A | * | 6/1998 | Lakshmikumar et al. ... 327/536 |
| 5,936,445 | A | * | 8/1999 | Babanezhad et al. ........ 327/157 |
| 6,011,822 | A | * | 1/2000 | Dreyer ........................ 375/376 |
| 6,255,873 | B1 | * | 7/2001 | Johnson et al. .............. 327/157 |
| 6,466,097 | B1 | * | 10/2002 | Celant et al. .................. 331/17 |
| 6,531,913 | B1 | * | 3/2003 | Ross ........................... 327/536 |

FOREIGN PATENT DOCUMENTS

| DE | 19617635 | 11/1997 |
| EP | 0718978 A1 | 6/1996 |

* cited by examiner

Primary Examiner—Tesfadet Bocure
(74) Attorney, Agent, or Firm—Aaron Waxler (57) ABSTRACT

A differential charge pump with integrated common-mode control circuitry (100) for a fully differential phase-locked loop is described, having two output lines (OUT$_+$; OUT$_-$) and including a charge pump section (103) and a common-mode feedback section (106). In the charge pump section (103), current generating circuitry (111, 112, 113, 114) generates a first current signal having a first magnitude and a certain polarity on the first signal output (OUT$_+$), and a second current signal having a second magnitude and opposite polarity on the second signal output (OUT$_-$). The common-mode feedback section (106) senses the common-mode voltage level ($V_{CM}$) of said first and second signal outputs (OUT$_+$, OUT$_-$), compares the common mode voltage ($V_{CM}$) with a reference voltage ($V_{SET}$), and generates a feedback signal influencing the current generating circuitry (111, 112, 113, 114) of the charge pump section (103), for increasing/decreasing the first magnitude of the first current signal and simultaneously decreasing/increasing the second magnitude of the second current signal, in order to steer the common-mode voltage level ($V_{CM}$) towards the reference voltage ($V_{SET}$).

6 Claims, 4 Drawing Sheets

FIG. 3

DIFFERENTIAL PHASE-LOCKED-LOOP CIRCUIT

BACKGROUND OF THE INVENTION

The present invention relates in general to a phase locked loop circuit, especially in an integrated circuit.

When a phase locked loop circuit (PLL) is incorporated in an integrated circuit, where the PLL shares a substrate with other circuitry, such other circuitry may generate noise in the substrate and/or on the supply lines, which noise may reach the PLL and may disturb its performance, especially its spectral purity. This will lead to unacceptable time jitter in the output signal of the PLL. If the PLL is used in clock signal generation circuitry, excessive quantization noise may be generated in circuits controlled by such clock signals, such as for instance A/D converters.

SUMMARY OF THE INVENTION

Therefore, a main object of the present invention is to provide a PLL circuit with improved noise performance.

A well-known technique for making a circuit less sensitive to substrate noise and supply noise is to implement such circuit in a differential architecture. A circuit implemented in differential architecture is not, or only to a little extent, sensitive to common mode signals, while noise on the supply lines and noise in the substrate would couple to the circuit in common mode. Therefore, the effect of such noise in a differential circuit is minimal.

Therefore, a further object of the present invention is to provide a PLL circuit in differential architecture.

An essential component of a PLL is a voltage controlled oscillator (VCO), the output of which is coupled to a phase comparator which compares the output of the VCO with an input signal. A control signal for the VCO is derived from the output signal of the phase comparator. The control input or tuning input of the VCO is, in respect of noise sensitivity, the most important circuit node in a PLL. Typically, the tuning sensitivity of a VCO amounts to several MHz/V. Therefore, even small disturbances that reach the tuning input of the VCO may lead to unacceptably high phase noise side bands (and hence large time jitter).

Therefore, in order to reduce the sensitivity of a PLL with respect to substrate noise and supply noise, especially the VCO tuning part of the PLL circuit should be implemented in a differential architecture.

Figure 1:
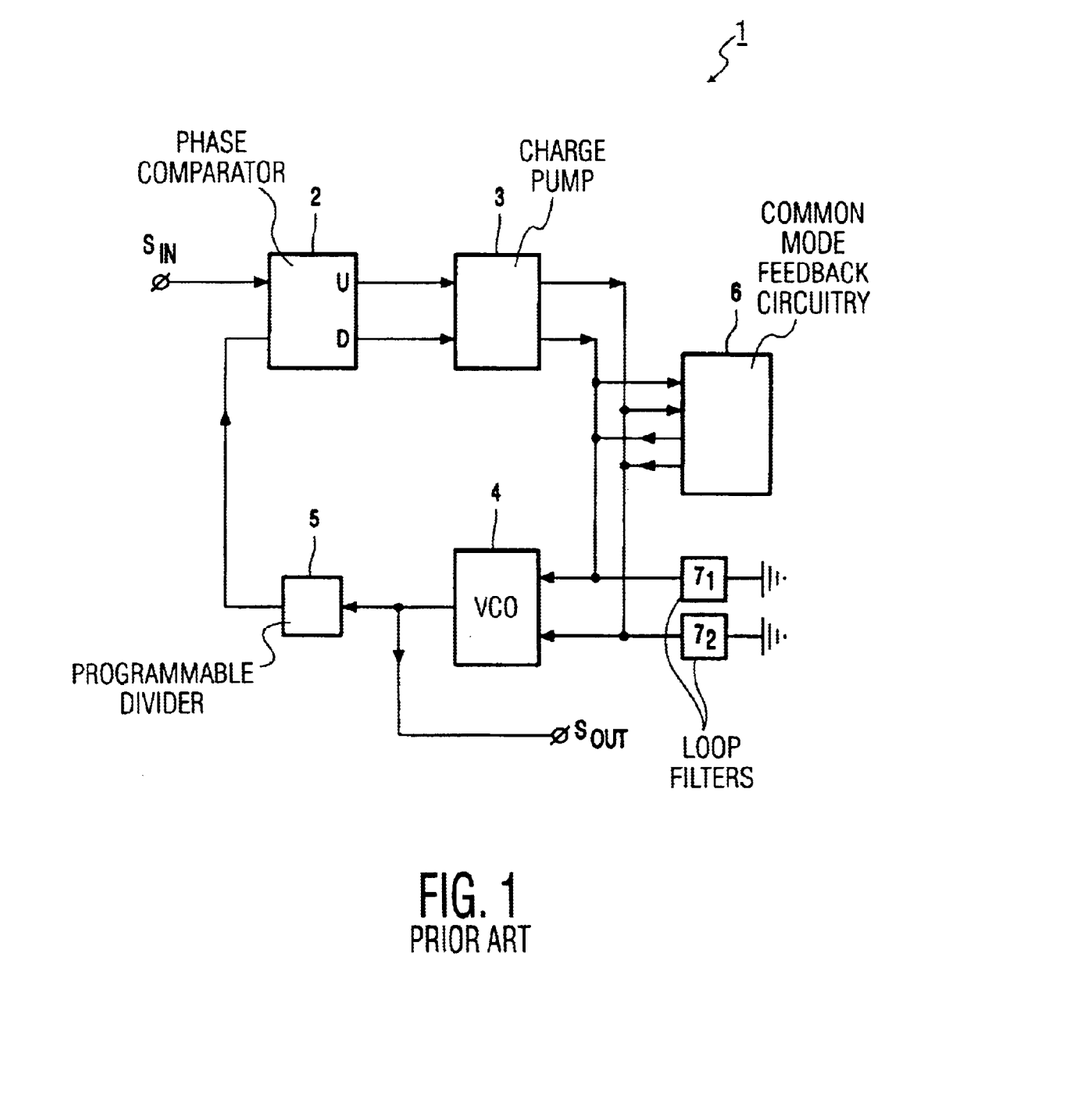
FIG. 1 schematically shows a block diagram of a prior art PLL circuit with fully differential implementation.

A block diagram of the general implementation of a PLL, as is commonly known in practice, is schematically depicted in FIG. 1. This PLL circuit 1 comprises a phase comparator 2, a charge pump 3, a VCO 4, and usually a programmable divider 5. The phase comparator 2 has two inputs, one input receiving an input signal SIN, and another input receiving an output signal from the VCO 4 through the programmable divider 5. The phase comparator 2 has two outputs, an UP-output U and a DOWN-output D, coupled to corresponding inputs of the charge pump 3. The charge pump 3 has an output coupled to a tuning input of the VCO 4. Depending on the signal received at said tuning input, the VCO 4 will increase or decrease the frequency of its output signal $S_{OUT}$.

In the implementation as depicted in the block diagram of FIG. 1, the VCO tuning part of the PLL circuit is implemented in differential architecture, as is commonly known in practice. More particularly, the charge pump 3 has a differential output, and the VCO has a differential tuning input, implicating that the coupling between the charge pump 3 and the VCO comprises two signal lines, as shown specifically. Similarly, the coupling between VCO 4 and programmable divider 5, the output line, the coupling between programmable divider 5 and phase comparator 2, the input line, the coupling between UP-output U of the phase comparator 2 and the corresponding input of the charge pump 3, and the coupling between DOWN-output D of the phase comparator 2 and the corresponding input of the charge pump 3 may all be implemented differentially, in order to provide a fully differential architecture, but this is not shown specifically in FIG. 1.

FIG. 1 also shows two loop filters $7_1$ and $7_2$, connected to the tuning inputs of the VCO, for converting a current output signal of the charge pump 3 into a voltage input signal for the VCO and for increasing stability of the system. Such loop filters are known per se, and will not be discussed further.

If the voltage level at both input terminals of the VCO 4 is changed with the same amount, the output frequency of the VCO 4 will remain constant. Thus, such differential implementation leads to a cleaner VCO output signal as regards common mode substrate noise and supply noise.

However, implementing the VCO tuning part of the PLL circuit in differential architecture will lead to other problems. In comparison with a single-ended implementation of a PLL, where the VCO has only one tuning input coupled to a single-ended charge pump, the VCO now has a differential tuning input receiving two tuning signals, of which the common mode voltage level must be controlled by a common mode feedback circuitry, indicated at 6 in FIG. 1. A basic problem in this respect is the fact that the common mode feedback circuitry 6 constitutes an additional circuitry capable of generating signals on the sensitive tuning inputs of the VCO. Especially, prior art implementations of such common mode feedback circuitry for differential architecture have the important drawback of adding a significant amount of noise to the tuning input of the VCO. This added noise causes unwanted modulation of the VCO and leads to a degradation of the spectral purity. Such noise sources are absent in a single-ended PLL configuration.

Therefore, it is a specific object of the present invention to combine the advantages of having a fully differential implementation of a PLL, having common mode control of the tuning voltage of the VCO, and having a noise level comparable to state of the art single ended PLL implementations.

According to an important aspect of the present invention, the common mode feedback circuitry influences the operation of the charge pump directly. In other words, instead of adding a correction current to the tuning input lines of the VCO, the charge pump generates an amended current.

These and other aspects, characteristics and advantages of the present invention will be further clarified by the following description of a preferred embodiment of a control circuitry in accordance with the invention, with reference to the drawings, in which same reference numerals indicate equal or similar parts, and in which:

DESCRIPTION OF THE PREFERRED EMBODIMENTS

Figure 2A:
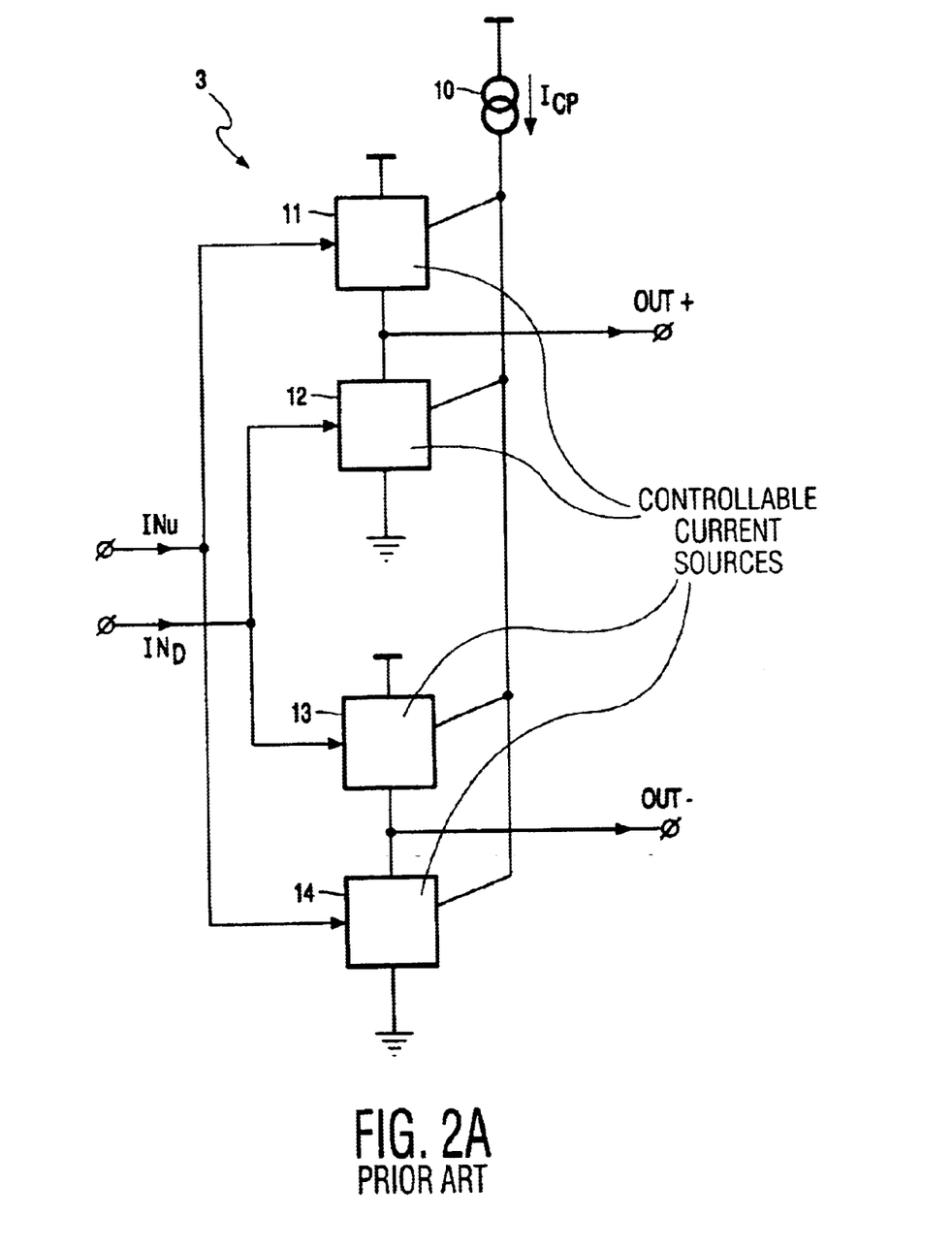
FIG. 2A schematically illustrates an implementation of a prior art differential charge pump.
Figure 2B:
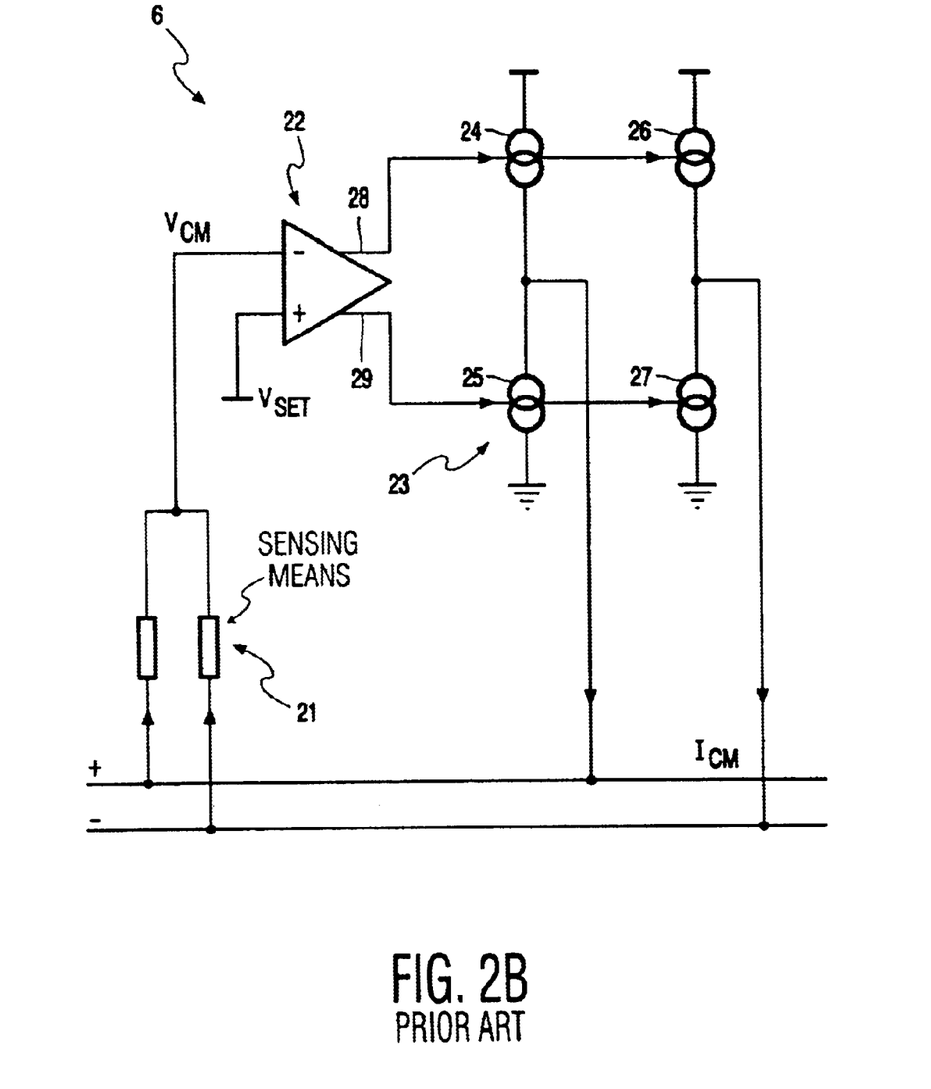
FIG. 2B schematically illustrates an implementation of a prior art common mode feedback circuitry.

In state of the art differential PLL circuitry, the differential charge pump is implemented as schematically illustrated in FIG. 2A, and the common mode feedback circuitry is implemented as schematically illustrated in FIG. 2B.

The state of the art differential charge pump 3 has two inputs $IN_U$ and $IN_D$ respectively, and two outputs $OUT_+$ and $OUT_-$, respectively, and further comprises four controllable current sources 11, 12, 13, 14, fed by a main current source 10, which generates a main current of magnitude $I_{CP}$.

The first controllable current source 11 is arranged for supplying a first current into the positive output $OUT_+$.
The second controllable current source 12 is arranged for drawing a second current from the positive output $OUT_+$.
The third controllable current source 13 is arranged for supplying a third current into the negative output $OUT_-$.
The fourth controllable current source 14 is arranged for drawing a fourth current from the negative output $OUT_-$.
The first and fourth current sources 11 and 14 have control inputs connected to the UP-input $IN_U$, and are controlled by a control signal received at this input $IN_U$. The second and third controllable current sources 12 and 13 have control inputs coupled to the DOWN-input $IN_D$, and are controlled by a control signal received at this DOWN-input $IN_D$. In general, said four controllable current sources 11–14 may be considered as controlled switches, switching the current received at their current inputs either to their current outputs or to ground.

More particularly, said four controllable current sources are arranged for generating, at their current outputs, current pulses of a magnitude $I_{CP}$, having a width proportional to $\Delta\phi$, wherein $\Delta\phi$ is the phase difference between the two input signals of the phase comparator. Ideally, the current pulses on the lines $OUT_+$ and $OUT_-$ have the same magnitude but opposite polarity. This can be expressed by the following relationships:

$$I(OUT_+) = +\alpha \cdot \Delta\phi \cdot I_{CP} \quad (1a)$$

$$I(OUT_-) = -\alpha \cdot \Delta\phi \cdot I_{CP} \quad (1b)$$

wherein $\alpha$ is a proportionality constant.

For small phase differences, the width of the current pulses approaches zero. When the phase difference $\Delta\phi$ is exactly zero, the width of the current pulses, however, is not exactly zero, because the charge pumps are still supplied with UP and DOWN signals with a minimum width $\tau_R$. This minimum width is equal to the reset time of the logical elements in the phase comparator. The noise contribution of the charge pumps is greatly attenuated by the small duty cycle of the UP- and DOWN-signals when the phase difference is zero ("in lock"), and is not a problem in respect of the noise performance of a fully differential PLL implementation.

The state of the art differential implementation of the common mode feedback circuitry 6 comprises generally, as indicated in FIG. 2B, sensing means 21 for detecting the common mode voltage level $V_{CM}$ of the tuning inputs of the VCO, comparing means 22 comparing this common mode voltage level $V_{CM}$ with a target value $V_{SET}$, and adjustment means 23 adjusting the voltage levels on said tuning inputs in the proper direction, such that the common mode voltage level $V_{CM}$ of the tuning inputs of the VCO will eventually be equal to $V_{SET}$. In the implementation as illustrated in FIG. 2B, this adjustment means comprise four controllable current sources 24, 25, 26, 27, controlled by output signals of the comparator means 22.

The first controllable current source 24 is arranged for supplying a first current into the positive VCO input.
The second controllable current source 25 is arranged for drawing a second current from the positive VCO input.
The third controllable current source 26 is arranged for supplying a third current into the negative VCO input.
The fourth controllable current source 27 is arranged for drawing a fourth current from the negative VCO input.
The first and third controllable current sources 24 and 26 are controlled by a first output 28 of the comparator means 22, whereas the second and fourth controllable current sources 25 and 27 are controlled by a second output 29 of the comparator means 22.

The magnitude of the current supplied by the current sources 24 to 27 is proportional to the voltage difference at the two inputs of the comparator means 22. When the common mode voltage $V_{CM}$ is lower than the target voltage $V_{SET}$, the first and third current sources 24 and 26 supply current $I_{CM}$ to the tuning inputs, increasing the common mode voltage $V_{CM}$. When the common mode voltage $V_{CM}$ is higher than $V_{SET}$, the second and fourth current sources 25 and 27 draw current $I_{CM}$ from the tuning inputs, decreasing the common mode voltage $V_{CM}$. This can be expressed by the following relationship:

$$I_{CM} = \beta \cdot (V_{SET} - V_{CM}) \quad (2)$$

An important drawback of this state of the art implementation is that the common mode feedback circuitry is continuously active. More particularly, the four controllable current sources 24–27 are continuously operatively coupled to the VCO tuning inputs, having as consequence that noise is injected into the VCO tuning input.

Although a certain fraction of the noise will be common mode, for instance the noise which originates in the comparator means 22, a large part of the noise is uncorrelated, such as for instance shot noise in the current sources 24 to 27, causing degeneration of the VCO's spectral purity.

This drawback outweighs the advantage of having a fully differential implementation of the PLL.

According to the invention, these drawbacks are overcome by integrating the charge pump circuitry and the common mode control circuitry in such a way, that the feedback of the common mode control circuitry is not directed to the VCO tuning inputs but to current sources of the charge pump.

This aspect of the present invention will be explained in more detail by the following discussion of an embodiment of a combined charge pump and common mode control circuitry 100, illustrated in FIG. 3.

The circuit 100 according to the invention comprises a differential charge pump section 103 and a common mode feedback section 106. The differential charge pump section 103 has two inputs $IN_U$ and $IN_D$ respectively, and two outputs $OUT_+$ and $OUT_-$, respectively, and further comprises four controllable current sources 111, 112, 113, 114.
The first controllable current source 111 is arranged for supplying a first current into the positive output $OUT_+$.
The second controllable current source 112 is arranged for drawing a second current from the positive output $OUT_+$.
The third controllable current source 113 is arranged for supplying a third current into the negative output $OUT_-$.
The fourth controllable current source 114 is arranged for drawing a fourth current from the negative output $OUT_-$.

The first and third current sources 111 and 113 are fed by a first main current source 110A, and the second and fourth current sources 112 and 114 are fed by a second main current source 110B, which generate a first and second main current of magnitude $I_{CP}$, respectively.

The first and fourth current sources 111 and 114 have control inputs connected to the UP-input $IN_U$, and are controlled by a control signal received at this input $IN_U$. The second and third controllable current sources 112 and 113 have control inputs coupled to the DOWN-input $IN_D$, and are controlled by a control signal received at this DOWN-input $IN_D$.

The circuit 100 according to the invention comprises a common mode feedback circuitry 106, which generally comprises sensing means 121 for detecting the common mode voltage level $V_{CM}$ of the output lines $OUT_+$ and $OUT_-$, comparing means 122 comparing this common mode voltage level $V_{CM}$ with a target value $V_{SET}$, and adjustment means 123 adjusting the currents generated by said controllable current sources 111–114 of the charge pump 103 in the proper direction, such that the common mode voltage level $V_{CM}$ of the output lines $OUT_+$ and $OUT_-$ will eventually be equal to $V_{SET}$.

Figure 3:
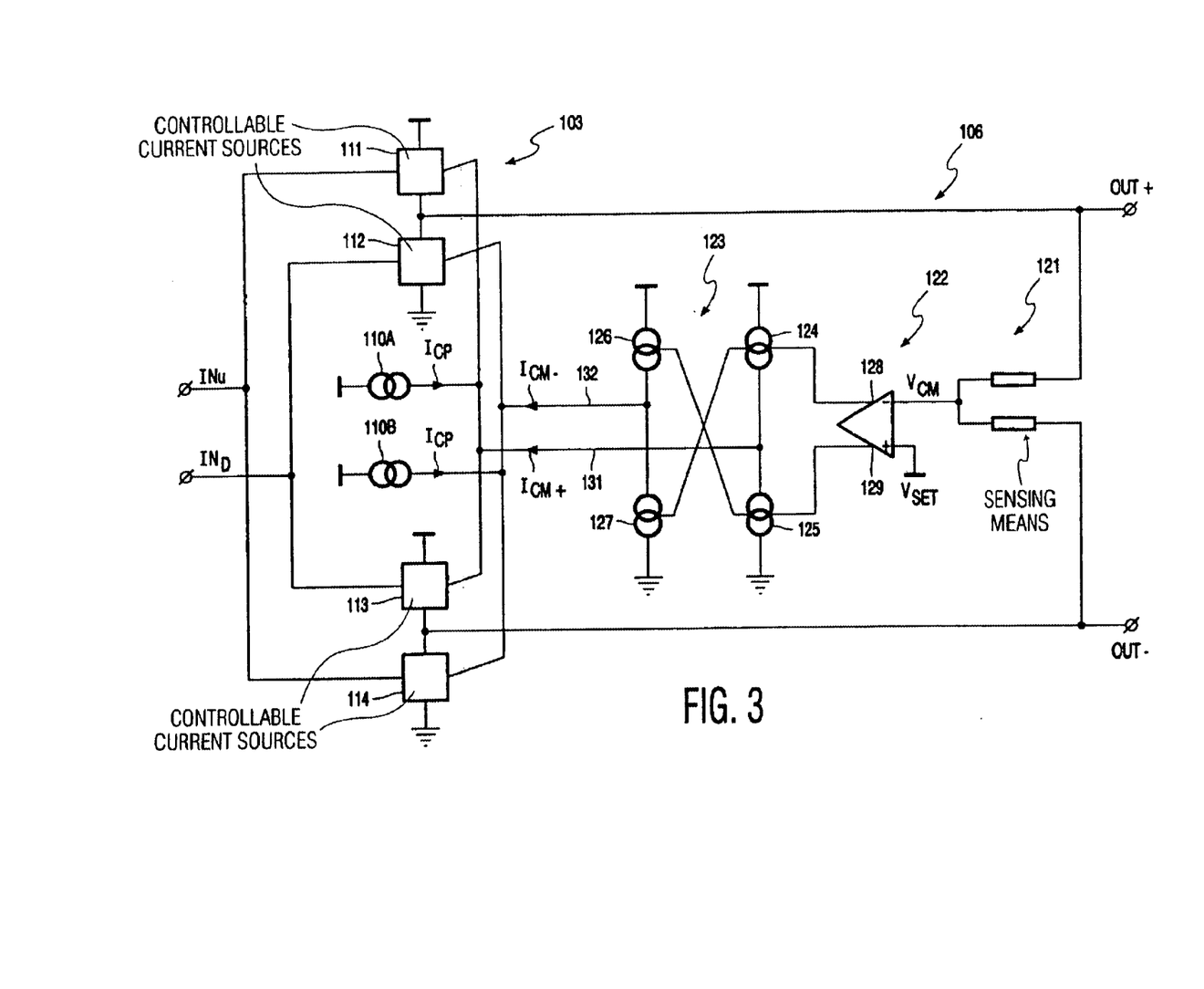
FIG. 3 schematically illustrates a block diagram of a charge pump with integrated common-mode control in accordance with the present invention.

In the implementation as illustrated in FIG. 3, said adjustment means 123 has a first output 131 connected to the output of the first main current source 110A, and a second output 132 connected to the output of the second main current source 110B.

Further, in the implementation as illustrated in FIG. 3, said adjustment means 123 comprises four controllable auxiliary current sources 124, 125, 126, 127, controlled by output signals of the comparator means 122.

The first controllable auxiliary current source 124 is arranged for supplying a first current into the first output 131 of the adjustment means 123.

The second controllable auxiliary current source 125 is arranged for drawing a second current from the first output 131 of the adjustment means 123.

The third controllable auxiliary current source 126 is arranged for supplying a third current into the second output 132 of the adjustment means 123.

The fourth controllable auxiliary current source 27 is arranged for drawing a fourth current from the second output 132 of the adjustment means 123.

The first and fourth controllable auxiliary current sources 124 and 127 are controlled by a first output 128 of the comparator means 122, whereas the second and third controllable current sources 125 and 126 are controlled by a second output 129 of the comparator means 122.

The magnitude of the current supplied by the current sources 124 to 127 is proportional to the voltage difference at the two inputs of the comparator means 122. Further, when the common mode voltage $V_{CM}$ is lower than the target voltage $V_{SET}$, the first controllable auxiliary current source 124 supplies current $I_{CM}$ to the first output 131 of the adjustment means 123, indicated as $I_{CM+}$ in FIG. 3, while the fourth controllable auxiliary current source 127 draws current $I_{CM}$ from the second output 132 of the adjustment means 123, indicated as $I_{CM-}$ in FIG. 3, both in response to a control signal generated by the comparator means 122 at its first output 128. Conversely, when the common mode voltage $V_{CM}$ is higher than $V_{SET}$, the second controllable auxiliary current source 125 draws current $I_{CM}$ from the first output 131 of the adjustment means 123, while the third controllable auxiliary current source 126 supplies current $I_{CM}$ to the second output 132 of the adjustment means 123, both in response to a control signal generated by the comparator means 122 at its second output 129.

This can be expressed by the following relationship:

$$I(131) = -I(132) = I_{CM} = \beta \cdot (V_{SET} - V_{CM}) \tag{3}$$

In charge pump section 103, first and third controllable current sources 111 and 113 are controlled by the combination of the currents generated at the output of the first main current source 110A and at the first output 131 of the adjustment means 123, respectively. Thus, the control current $I_{F1}$ for the first and third controllable current sources 111 and 113 is described by the following relationship:

$$I_{F1} = I_{CP} + I(131) = I_{CP} + I_{CM} \tag{4a}$$

Similarly, second and fourth controllable current sources 112 and 114 are controlled by a second control current $I_{F2}$, that obeys the following relationship:

$$I_{F2} = I_{CP} + I(132) = I_{CP} - I_{CM} \tag{4b}$$

In a similar manner as explained above with reference to the prior art charge pump 3, said four controllable current sources 111 to 114 are arranged for generating current pulses having a width proportional to $\Delta\phi$ and a magnitude proportional to $I_{F1}, I_{F2}$. Thus, similar to the relations (1a)–(1b), the current pulses outputted by the circuit 100 according to the invention can be expressed by the following relationships:

$$I(OUT_+) = +\alpha \cdot \Delta\phi \cdot I_{F1} = +\alpha \cdot \Delta\phi \cdot I_{CP} + \alpha \cdot \Delta\phi \cdot I_{CM} \tag{5a}$$

$$I(OUT_-) = -\alpha \cdot \Delta\phi \cdot I_{F1} = +\alpha \cdot \Delta\phi \cdot I_{CP} + \alpha \cdot \Delta\phi \cdot I_{CM} \tag{5b}$$

From the above relationships, it would follow that $I(OUT_+)$ and $I(OUT_-)$ are zero when the input signal $S_{IN}$ is in exact lock with the feedback signal at the inputs of the phase comparator 2, i.e. when the phase difference $\Delta\phi$ is zero. However, even when the phase difference $\Delta\phi$ is zero, the logical elements in the phase comparator 2 generate signals which cause all four controllable current sources 111–114 to generate very small current pulses simultaneously. This can be expressed by replacing $\Delta\phi$ by $(\Delta\phi + \tau_R/T)$ in the above formulae (5a–b), wherein $\tau_R$ is a constant which represents the reset time of flip-flops in the phase comparator 2, and wherein T is the period of the signal $S_{IN}$ in FIG. 1. Thus, when the phase difference $\Delta\phi$ is zero, said four controllable current sources 111–114 of the charge pump 103 generate current pulses during said reset time, which can be expressed by the following relationships:

$$I_{111} = +\alpha \cdot \tau_R/T \cdot I_{F1} = +\alpha \cdot \tau_R/T \cdot I_{CP} + \alpha \cdot \tau_R/T \cdot \beta \cdot (V_{SET} - V_{CM}) \tag{6a}$$

$$I_{112} = -\alpha \cdot \tau_R/T \cdot I_{F2} = -\alpha \cdot \tau_R/T \cdot I_{CP} + \alpha \cdot \tau_R/T \cdot \beta \cdot (V_{SET} - V_{CM}) \tag{6b}$$

$$I_{113} = +\alpha \cdot \tau_R/T \cdot I_{F1} = +\alpha \cdot \tau_R/T \cdot I_{CP} + \alpha \cdot \tau_R/T \cdot \beta \cdot (V_{SET} - V_{CM}) \tag{6c}$$

$$I_{114} = -\alpha \cdot \tau_R/T \cdot I_{F2} = -\alpha \cdot \tau_R/T \cdot I_{CP} + \alpha \cdot \tau_R/T \cdot \beta \cdot (V_{SET} - V_{CM}) \tag{6d}$$

$$I(OUT_+) = I_{111} + I_{112} = 2\alpha \cdot \tau_R/T \cdot \beta \cdot (V_{SET} - V_{CM}) \tag{7a}$$

$$I(OUT_-) = I_{113} + I_{114} = 2\alpha \cdot \tau_R/T \cdot \beta \cdot (V_{SET} - V_{CM}) \tag{7b}$$

Thus, even when the loop is perfectly locked, the common mode feedback signal is effective through the four controllable current sources 111–114 of the charge pump 103. Since, as mentioned earlier, the four controllable current sources 111–114 of the charge pump 103 have a very small duty cycle in this situation, any noise contribution from the common mode feedback signal is greatly attenuated, which makes that the differential phase locked loop according to the present invention has a very low noise level.

An important advantage of the combined charge pump with common-mode control proposed by the invention is that the common-mode control section 106 does not have an output connected to the tuning input lines of the VCO; instead, the output current of the common-mode control section 106 is fed back to the charge pump section 103 itself, and is more particularly used to modulate the feeding current for the current source units in the charge pump. As explained with reference to FIGS. 2A–B, in the prior art, the feeding current $I_{CP}$ is constant, independent of the common-mode voltage level of the tuning input lines of the VCO. In contrast, in the circuit 100 according to the invention, the feeding current $I_F$ has a component that is proportional to the difference between $V_{SET}$ and $V_{CM}$. Thereby, any noise of the output current $I_{CM}$ of the common-mode control section 106 is attenuated by the switching action of the current source units in the charge pump, similarly to the attenuation of noise in the main charge pump feeding current $I_{CP}$.

Further, it is noted that the control of the common-mode voltage can be performed without the need for changes in $\Delta\phi$, therefore without causing any disturbances in the spectral purity of the VCO.

Thus, the present invention provides a differential charge pump with integrated common-mode control circuitry 100 for a fully differential phase-locked loop, having two output lines $OUT_+$; $OUT_-$ and comprising a charge pump section 103 and a common-mode feedback section 106. In the charge pump section 103, current generating means 111, 112, 113, 114 generate a first current signal having a first magnitude and a certain polarity on said first signal output $OUT_+$, and a second current signal having a second magnitude and opposite polarity on said second signal output $OUT_-$. The common-mode feedback section 106 senses the common-mode voltage level $V_{CM}$ of said first and second signal outputs $OUT_+$, $OUT_-$, compares said common mode voltage $V_{CM}$ with a reference voltage $V_{SET}$, and generates a feedback signal influencing said current generating means 111, 112, 113, 114 of the charge pump section 103, for increasing/decreasing the first magnitude of the first current signal and simultaneously decreasing/increasing the second magnitude of the second current signal, in order to steer said common-mode voltage level $V_{CM}$ towards said reference voltage $V_{SET}$.

It should be clear to a person skilled in the art that the scope of the present invention is not limited to the examples discussed in the above, but that several amendments and modifications are possible without departing from the scope of the invention as defined in the appending claims.

For instance, it is not necessary for the adjustment means 123 to have four controllable auxiliary current sources 124–127. In a simplified version, the adjustment means 123 may have only one pair of controllable auxiliary current sources, such as the pair 124/125 or the pair 126/127, each current source of such pair supplying and drawing, respectively, current to and from only one feedback output line 131 or 132, which is operatively coupled to only one master current source 110A or 110B. With respect to the embodiment depicted in FIG. 3, such can be accomplished by removing the current sources 126/127 and their output line 132, or by removing the current sources 124/125 and their output line 131, respectively. This can be seen as follows.

Suppose that the loop is perfectly locked ($\Delta\phi=0$), and that the common mode voltage is low ($V_{CM}<V_{SET}$). Then, during said reset period $\tau_R$, both output lines $OUT_+$ and $OUT_-$ receive current pulses of same magnitude raising the voltage level on each of said lines with an equal amount, as can be seen from equations (7a–b). In the example described above, the magnitude of the current pulses is $2\alpha\cdot\tau_R/T\cdot\beta\cdot(V_{SET}-V_{CM})$, because feedback current is provided at both feedback outputs 131 and 132. If only one feedback output 131 would have been present, the above equations are still valid, provided that:

in equation (4b), current I(132) should be replaced by zero; equation (5b) should be read as $I(OUT_-)=-\alpha\cdot\Delta\phi\cdot I_{CP}$; equation (6b) should be read as $I_{112}=-\alpha\cdot\tau_R/T\cdot I_{CP}$; equation (6d) should be read as $I_{114}=-\alpha\cdot\tau_R/T\cdot I_{CP}$; and the right-hand term in equations (7a–b) should be replaced by $\alpha\cdot\tau_R/T\cdot\beta\cdot(V_{SET}-V_{CM})$.

Still, the common mode voltage would be raised during said reset time without influencing the differential signal. The embodiment of FIG. 3 is more efficient in that the common mode voltage would be corrected two times as quick.

What is claimed is:

1. Differential charge pump with integrated common-mode control circuitry (100) for a phase-locked loop, comprising:

a charge pump section (103) having a first signal output ($OUT_+$) and a second signal output ($OUT_-$);

current generating means (111, 112, 113, 114) for generating a first current signal having a first magnitude and a certain polarity on said first signal output ($OUT_+$), and for generating a second current signal having a second magnitude and opposite polarity on said second signal output ($OUT_-$);

and a common-mode feedback section (106), comprising:

sensing means (121) for sensing the common-mode voltage level ($V_{CM}$) of said first and second signal outputs ($OUT_+$, $OUT_-$);

comparing means (122) for comparing said common mode voltage ($V_{CM}$) of said two signal outputs with a reference voltage ($V_{SET}$);

and controllable means (124, 125, 126, 127) controlled by said comparing means (122) for increasing the first magnitude of the first current signal and simultaneously decreasing the second magnitude of the second current signal, or decreasing the first magnitude of the first current signal and simultaneously increasing the second magnitude of the second current signal, respectively, in response to control signal generated by said comparing means (122) based on the result of said comparison.

2. Differential charge pump according to claim 1, further comprising first and second current reference sources (110A, 110B) for generating first and second current reference signals, respectively;

wherein said current generating means (111, 112, 113, 114) are adapted to generate said first and second current signals, respectively, based on said first and second current reference signals, respectively;

and wherein said controllable means (124, 125, 126, 127) of the common-mode feedback section (106) are adapted to increase/decrease the first current reference signal and simultaneously decrease/increase the second current reference signal, respectively.

3. Differential charge pump according to claim 2, wherein said current generating means (111, 112, 113, 114) are adapted to generate said first and second current signals, respectively, as current pulses having a magnitude equal to said first and second current reference signals, and having a width depending on control signals received at control inputs ($IN_U$; $IN_D$).

4. Differential charge pump according to claim 2, wherein said controllable means (124, 125, 126, 127) of the common-mode feedback section (106) are adapted to add current signals of mutually same polarity to the first and second current reference signals, respectively.

5. Fully differential phase locked loop circuit, comprising:
  a differential voltage controlled oscillator (4) having two inputs and at least one output;
  a differential phase comparator (2) having two inputs, one input for receiving an input signal ($S_{IN}$), and another input coupled with an output of the voltage controlled oscillator (4), possibly through a programmable divider (5), the phase comparator (2) further having two outputs (U, D);
  a differential charge pump with integrated common-mode control circuitry (100) according to claim 1, the first control input (UP) of the circuitry (100) being connected to one output (U) of the phase comparator (2), the second control input (DOWN) of the circuitry (100) being connected to the other output (D) of the phase comparator (2), the first signal output (OUT$_+$) being connected to one input of the voltage controlled oscillator (4), and the second signal output (OUT$_-$) being connected to the other input of the voltage controlled oscillator (4).

6. Differential charge pump with integrated common-mode control circuitry (100) for a phase-locked loop, comprising:
  a first control input (UP) and a second control input (DOWN);
  a first signal output (OUT$_+$) and a second signal output (OUT$_-$);
  controllable current generating means (103) coupled to said two control inputs and to said two signal outputs, and adapted to raise the voltage level of said first signal output and to simultaneously lower the voltage level of said second signal output or to lower the voltage level of said first signal output and to simultaneously raise the voltage level of said second signal output in response to control signals received at said two control inputs;
  and feedback means (106) coupled between said two signal outputs and said controllable current generating means (103), and adapted compare the common mode voltage ($V_{CM}$) of said two signal outputs with a reference voltage ($V_{SET}$) and to simultaneously raise the voltage level of both of said signal outputs or to simultaneously lower the voltage level of both of said signal outputs in dependency of the result of said comparison;
  wherein said controllable current generating means (103) comprises:
    a first controllable current source (111) having a control input coupled to said first control input (UP) and having a current output coupled to said first signal output (OUT$_+$), and being adapted to raise to voltage level of said first signal output in response to a first control signal received at said first control input (UP);
    a second controllable current source (112) having a control input coupled to said second control input (DOWN) and having a current output coupled to said first signal output (OUT$_+$), and being adapted to lower to voltage level of said first signal output in response to a second control signal received at said second control input (DOWN);
    a third controllable current source (113) having a control input coupled to said second control input (DOWN) and having a current output coupled to said second signal output (OUT$_-$), and being adapted to raise to voltage level of said second signal output in response to said second control signal received at said second control input (DOWN);
    a fourth controllable current source (114) having a control input coupled to said first control input (UP) and having a current output coupled to said second signal output (OUT$_-$), and being adapted to lower to voltage level of said second signal output in response to said first control signal received at said first control input (UP);
  wherein each of said controllable current sources (111–114) has a current input coupled to a current output of a corresponding main current source (110A, 110B), and wherein each of said controllable current sources (111–114) is adapted to generate current pulses, the magnitude of these current pulses depending on the current provided by the corresponding main current source (110A, 110B), and the width of said current pulses depending on the corresponding control signal;
  wherein the current inputs of said first and third controllable current sources (111, 113) are coupled to the current output of a first main current source (110A), and wherein the current inputs of said second and fourth controllable current sources (112, 114) are coupled to the current output of a second main current source (110B);
  wherein said feedback means (106) have a first feedback current output (131) connected to said current output of said first main current source (110A), and a second feedback current output (132) connected to said current output of said second main current source (110B); and
  wherein said feedback means (106) comprise:
    common mode voltage detecting means (121) connected to the first signal output (OUT$_+$) and the second signal output (OUT$_-$), for detecting the common mode voltage ($V_{CM}$) of said two signal outputs;
    comparator means (122) for comparing the detected common mode voltage ($V_{CM}$) with a reference voltage ($V_{SET}$), the comparator means (122) having a normal output and an inverted output;
    a first controllable auxiliary current source (124) having a control input coupled to a first of said outputs of said comparator means (122) and having a current output coupled to said first feedback current output (131) for increasing the current ($I_{CM+}$) on said first feedback current output (131) in response to a first control signal of said comparator means (122);
    a second controllable auxiliary current source (125) having a control input coupled to a second of said outputs of said comparator means (122) and having a current output coupled to said first feedback current output (131) for decreasing the current ($I_{CM+}$) on said first feedback current output (131) in response to a second control signal of said comparator means (122);
    a third controllable auxiliary current source (126) having a control input coupled to said second output of said comparator means (122) and having a current output coupled to said second feedback current output (132) for increasing the current ($I_-$) on said second feedback current output (132) in response to said second control signal of said comparator means (122); and a fourth controllable auxiliary current source (127) having a control input coupled to said first output of said comparator means (122) and having a current output coupled to said second feedback current output (132) for decreasing the current ($I_{CM-}$) on said second feedback current output (132) in response to said first control signal of said comparator means (122).

\* \* \* \* \*